(12) United States Patent
Nielsen

(10) Patent No.: US 9,983,241 B2
(45) Date of Patent: May 29, 2018

(54) METHOD AND A CONTROL UNIT FOR VALIDATING AN ELECTRIC POWER PLANT

(71) Applicant: Siemens Aktiengesellschaft, Munich (DE)

(72) Inventor: Kaj Skov Nielsen, Issaquah, WA (US)

(73) Assignee: Siemens Aktiengesellschaft, Munich (DE)

( * ) Notice: Subject to any disclaimer, the term of this patent is extended or adjusted under 35 U.S.C. 154(b) by 696 days.

(21) Appl. No.: 14/492,359

(22) Filed: Sep. 22, 2014

(65) Prior Publication Data

US 2016/0084892 A1 Mar. 24, 2016

(51) Int. Cl.
| | |
|---|---|
| *G01R 21/00* | (2006.01) |
| *G01R 21/06* | (2006.01) |
| *F03B 13/26* | (2006.01) |
| *F03B 13/14* | (2006.01) |
| *H02S 10/00* | (2014.01) |
| *F03D 7/04* | (2006.01) |
| *F03D 17/00* | (2016.01) |
| *F03D 9/25* | (2016.01) |

(52) U.S. Cl.
CPC .............. *G01R 21/00* (2013.01); *F03B 13/14* (2013.01); *F03B 13/26* (2013.01); *F03D 7/048* (2013.01); *F03D 9/257* (2017.02); *F03D 17/00* (2016.05); *H02S 10/00* (2013.01); *F05B 2240/96* (2013.01); *F05B 2260/80* (2013.01); *F05B 2270/335* (2013.01); *Y02E 10/28* (2013.01); *Y02E 10/38* (2013.01); *Y02E 10/50* (2013.01); *Y02E 10/723* (2013.01)

(58) Field of Classification Search
CPC ......... G01R 21/00; F03D 17/00; F03D 9/257; F03D 7/048; F03B 13/14; F03B 13/26
USPC .......................................................... 702/61
See application file for complete search history.

(56) References Cited

U.S. PATENT DOCUMENTS

| | | | |
|---|---|---|---|
| 2005/0107989 A1* | 5/2005 | Henriksen | ............... F03D 7/047 702/188 |
| 2010/0207463 A1* | 8/2010 | Fortmann | ............. H02J 3/1885 307/153 |
| 2011/0260739 A1* | 10/2011 | Garcia | .................... H02J 3/386 324/652 |

(Continued)

OTHER PUBLICATIONS

English Abstract of Yu et al., CN 101667226, Mar. 10, 2010.*

*Primary Examiner* — Michael Nghiem
(74) *Attorney, Agent, or Firm* — Beusse Wolter Sanks & Maire

(57) ABSTRACT

A method for validating an electric power plant capability as an electric service provider is provided. The method includes receiving a plurality of input data records from the plurality of renewable energy devices, respectively, the input data records respectively defining a plurality of device capabilities associated with at least one electrical service which can be provided by the renewable energy devices to the electric distribution grid; estimating internal power losses of the electric power plant; using the input data records and the internal power losses for calculating an output data record defining an overall plant capability for the service; communicating the output data record to an operator of the electric distribution grid; and receiving a validation signal from the operator of the electric distribution grid.

18 Claims, 2 Drawing Sheets

(56) References Cited

U.S. PATENT DOCUMENTS

| | | | | |
|---|---|---|---|---|
| 2011/0309683 A1* | 12/2011 | Nielsen | ................ | F03D 7/0284 |
| | | | | 307/84 |
| 2013/0272844 A1* | 10/2013 | Lobato Pena | ........... | H02J 3/386 |
| | | | | 415/1 |
| 2013/0277969 A1* | 10/2013 | Nielsen | ................... | H02J 3/386 |
| | | | | 290/44 |
| 2014/0100810 A1* | 4/2014 | Nielsen | .............. | G05B 23/0256 |
| | | | | 702/109 |

* cited by examiner

METHOD AND A CONTROL UNIT FOR VALIDATING AN ELECTRIC POWER PLANT

FIELD OF INVENTION

The present invention relates to a method for validating an electric power plant capability and to a control unit for an electric power plant. In particular, the present invention relates to a method for validating an electric power plant including a plurality of renewable energy devices usable for providing a plurality of ancillary services to an electric distribution grid.

ART BACKGROUND

Utilities and grid operators have developed a variety of ways to improve reliability and increase economic efficiency in regional energy markets. To support the scheduling of energy on power systems, operators normally require ancillary services. Ancillary services products address short-term imbalances in electricity markets by dispatching resources within seconds or minutes of an unacceptable imbalance, and demand response practitioners have a role to play in helping to balance the system on a short-term basis. Ancillary services may include a number of different operations which include frequency support, voltage support, and system restoration. To encourage the individual participants of the market to provide these services, ancillary services markets are evolving.

It is difficult for some kind of renewable energy power plant, e.g. wind or tidal or wave or solar power plants, to qualify and be accepted for ancillary service markets. This is mainly caused by the uncertainty of the energy (from wind or tide or waves or sun, respectively) resource, but also by the trading horizon of the different markets.

The above considerations may be extended also to storage plants, whose energy capability would depend on the level of charge or discharge.

This will delay the entry of these kinds of power plants into the ancillary markets even if such plants potentially would be able to deliver some ancillary services at a competitive rate to the utility consumers.

For an electric power plant including a plurality of renewable energy devices, such as wind turbines, it is therefore desirable to provide a method for validating the plant as an ancillary service provider.

SUMMARY OF THE INVENTION

It may be an object of the present invention to provide a method for controlling an electric power plant and a controller, which provide the desirable requirements defined above.

In order to achieve the objects defined above, a method and a control unit according to the independent claim are provided. The dependent claims describe advantageous developments and modifications of the invention.

According to the present invention, a method for validating an electric power plant as an electric service provider, the electric power plant comprising a plurality of renewable energy devices connected to an electric distribution grid, the method comprising:

receiving a plurality of input data records from the plurality of renewable energy devices, respectively, the input data records respectively defining a plurality of device capabilities associated with at least one electrical service which can be provided by the renewable energy devices to the electric distribution grid, estimating internal power losses of the electric power plant, using the input data records and the internal power losses for calculating an output data record defining an overall plant capability for said service, communicating the output data to an operator of the electric distribution grid, receiving a validation signal from the operator of the electric distribution grid.

According to the method of the present invention, a plurality of input data record from a respective plurality of renewable energy devices of the power plant, are aggregated in order to generate output data record which represents the overall export capability of the power plant towards the electric distribution grid, such capability being related to an electrical service.

By "electrical service" it is meant any service which can be provided by the renewable energy devices of the power plant to the electric distribution grid to which they are connected. In particular the electrical service may be an ancillary service, e.g. under frequency response, over frequency response, ramping capability, reactive power capability or spinning reserve.

By "input data record" it is meant any of a matrix, vector, complex number, xml string or similar including a plurality of values which are available in an individual unit of each renewable energy devices and which represent the capability of each renewable energy device to provide an electrical service, in particular an ancillary service, to the electric distribution grid. In particular, each input data record may represent magnitudes and/or durations of an electrical service to be provided. Each input data record may represent the capability of each renewable energy device to provide more than one electrical service.

By "output data record" it is meant any of a matrix, vector, complex number, xml string or similar including a plurality of values which are calculated in a control unit of the power plant and which represent the overall capability of the plant to provide an electrical service, in particular an ancillary service, to the electric distribution grid. The control unit produce the output data record by aggregating the input data records, taking into account the internal power losses of the electric power plant. The output data record may include a numerical or character field, indicating which of the capabilities of the power plant, e.g. under frequency response, are made available for the electric distribution grid.

By "internal power losses" it is meant the sum of any loss of power or power degradation caused by each of the lines comprised in the power plant. Losses from the renewable energy devices to the electric distribution grid can be estimated as a fixed percentage of production, or by a complex line loss model or by a neural network based model based on past performance of the plant.

According to the method of the present invention the output data record is communicated to an operator or agent of the electric distribution grid in order that the output data can be possibly further aggregated on a power system level, according to the standards and needs of the electric distribution grid.

Advantageously, this allows an operator of the grid to be provided with a plurality of online data for quickly and easily validate the plant capabilities.

The method further comprises the step of receiving a validation signal from the operator of the electric distribution grid, for each service that the power plant is able to provide to the distribution grid. Advantageously, this gives the possibility to validate the capability of the power plant exclusively based on action by the grid operator.

According to a possible embodiment of the method of present invention, the method further comprises receiving a command from the operator of the electric distribution grid for executing the service associated with the output data record.

Advantageously, this allows the power plant to be efficiently integrated with the electric distribution grid and to cooperate with it, in particular as an ancillary service provider.

Advantageously, the present method may be applied during a commissioning and/or testing and/or normal operation of the electric power plant. This will allow the operator of the distribution grid to be confident, during normal operation periods, that the power plant is capable to provide ancillary services products to solve short-term imbalances.

According to possible embodiments of the method of the present invention, the plurality of renewable energy devices may be a plurality of wind turbines or a plurality of tidal turbine or a plurality of wave turbine or a plurality of solar generators or also a combination thereof (for example wind turbines and solar generators).

According to another possible embodiment of the method of the present invention, the electric power plant, in addition to the plurality of renewable energy devices, further comprises one or more other lines including at least a device for supplying power, for example a storage device or a static synchronous compensator (also known with the acronym STATCOM) or a reactor.

According a further exemplary embodiment of the method of the present invention, wherein the input and/or output data records include at least a record of values comprising a first value, a second value and a third value, in the format:

X1: percentage of an actual production or of an installed capacity of one of the renewable energy devices and/or of the electric power plant,
X2: ramp rate for reaching X1,
X3: duration of the service.

According to possible embodiments of the method of the present invention, the output data records may assume the following values:
X1: +6% to +10% of actual production (or installed capacity),
X2: $0.1*X1/t$ (where t represents time, for example in seconds),
X3: from 0 s to 10 s,
and/or
X4: +2% to +3% of actual production (or installed capacity),
X5: $0.1*X4/t$ (where t represents time, for example in seconds),
X6: from 10 s to 600 s,
and/or
X7: +1% of actual production (or installed capacity),
X8: $0.1*X7/t$ (where t represents time, for example in seconds),
X9: from 600 s to 1800 s.

Advantageously, output data records described above can be communicated to an operator of the grid, in order to show that the power plant may be used for under frequency response, i.e. when frequency drops below nominal value due to load exceeding generated power.

According to other possible embodiments of the method of present invention, the first value of the record, i.e. the percentage of actual production or absolute power value, is negative, thus meaning that the power plant is available to reduce the actual power output or even absorb power from the distribution grid, in order to achieve grid stability. This may be done efficiently particularly when the power plant comprises a storage device.

Alternatively, with a negative value of the first value of the record, output data records described above can be communicated to an operator of the grid, in order to show that the power plant may be used for over frequency response, i.e. when frequency rises over nominal value due to generated power exceeding load.

According to another aspect of the present invention, a central power control unit for controlling an electric power plant comprising a plurality of renewable energy devices is adapted for executing the method described above. Advantageously, this allows applying the present invention to existing power plants by adding a central power control unit according to the present invention or modifying an existing one.

BRIEF DESCRIPTION OF THE DRAWINGS

The aspects defined above and further aspects of the present invention are apparent from the examples of embodiment to be described hereinafter and are explained with reference to the examples of embodiment. The invention will be described in more detail hereinafter with reference to examples of embodiment but to which the invention is not limited.

DETAILED DESCRIPTION

Figure 1:
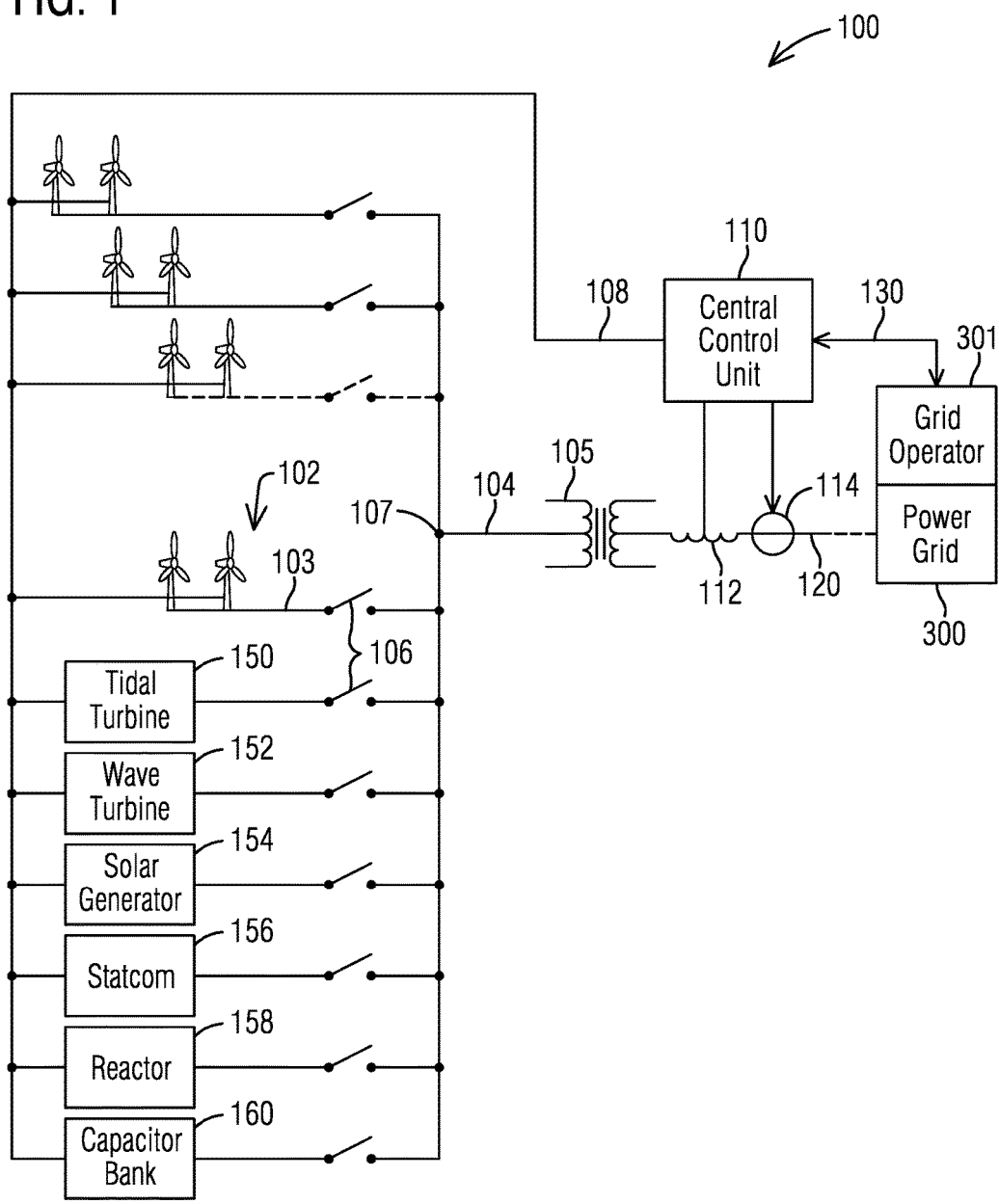
FIG. 1 schematically illustrates a power plant according to the present invention.

FIG. 1 shows an electric power plant 100 comprising a plurality of wind turbine lines 103, connected in parallel to combine their power output signal to a connection point 107. Each line 103 comprises one or more renewable energy devices, in particular wind turbines 102 (two wind turbines 102 in the embodiment in FIG. 1).

According to a possible variant embodiment of the present invention, instead of the wind turbine 102 each line 103 includes one or more tidal turbines 150 or wave turbines 152 or solar generators 154. In the following reference will be made to a plurality of lines 103 including wind turbine 102, but the same description may refer also to a plurality of lines 103 including tidal turbines 150 or wave turbines 152 or solar generators 154.

Each wind turbine 102 comprises a wind turbine tower having a nacelle mounted at the top of the tower, wherein the nacelle includes a hub at which one or more rotor blades are mounted. Impacting wind causes the rotor blades to move such that the hub connected to a rotor shaft is rotated. The rotor shaft in turn transfers its mechanical energy to a generator comprised in each of the wind turbines 102. The generator of each turbine 102 outputs a primary power signal which is converted by a (not shown) converter to a signal having a frequency and adjustable voltage amplitude. The power signal may further be filtered by a filter component within the turbine 102. The primary power signal is provided at the connection point 107 typically at a medium voltage amplitude value of several kV, for example 20 kV to 40 kV.

The plurality of wind turbines 102 includes a plurality of respective individual control units (not shown), each individual control unit serving a respective wind turbine 102, for controlling relevant variables for each of the wind turbines 102, for example speed and power generated.

The power signal from each turbine 102 is supplied via a respective line 103 to a switch 106. By activating the switch 106 selected wind turbine lines 103 may be connected to or disconnected from the connection point 107.

The primary power signal supplied to the connection point 107 is transformed by a transformer 105 to a secondary power signal supplied to an output line 120 for connecting the electric power plant 100 to an electric distribution grid 300. The secondary power signal has a higher voltage than the primary power signal.

The connection point 107 is linked to the transformer 105 by means of a medium voltage bus 104.

The output line 120 comprises a voltage measurement device 112 and a 3-phase current measurement device 114. Both the voltage measurement device 112 and the 3-phase current measurement device 114 are connected to a central control unit 110 which therefore receives data regarding voltage and current from the secondary power signal.

Alternatively, voltage and current measurements may be performed on the primary power signal, upstream or downstream the connection point 107.

The central control unit 110 is also connected, by means of a communication line 108, to each of the individual control units serving the wind turbines 102, in order to receive input data records about the status of each wind turbine 102, in particular about transient under frequency response capability, over frequency response capability, reactive power capability or any other ancillary service capability.

The input data records may be in the form of one or more records of the type:
X1: magnitude, in percentage of an actual production or of an installed capacity of each renewable energy devices 102, representing the power limit which, respectively, each renewable energy devices 102 can provide to, or absorb from the distribution grid,
X2: ramp rate for reaching X1 value,
X3: duration of the service.

The central control unit 110 may also receive additional information from the individual control units, e.g. speed of the rotor speed of each wind turbine 102.

According to a possible variant embodiment of the present invention (not shown) other lines not including any wind turbine are comprised in the power plant 100. In particular, for example, lines including a storage device or a static synchronous compensator (STATCOM) 156 or a reactor 158 or a plurality of capacitor banks 160 may be present. Also such lines may be connected to the central control unit 110 by means of the communication line 108.

The central control unit 110 is adapted to receive data from the individual control units of the wind turbines 102, from the voltage measurement device 112 and from the current measurement device 114 and to produce an output data record representing a magnitude and/or a duration of a service which can be provided from the power plant 100 to the electric distribution grid 300.

The power plant 100 further comprises an external communication line 130 for providing the output data record to an operator of the electric distribution grid 300.

In case of under frequency response each wind turbine 102 report to the central control unit 110 how much under frequency response it is capable of delivering.

Figure 2:
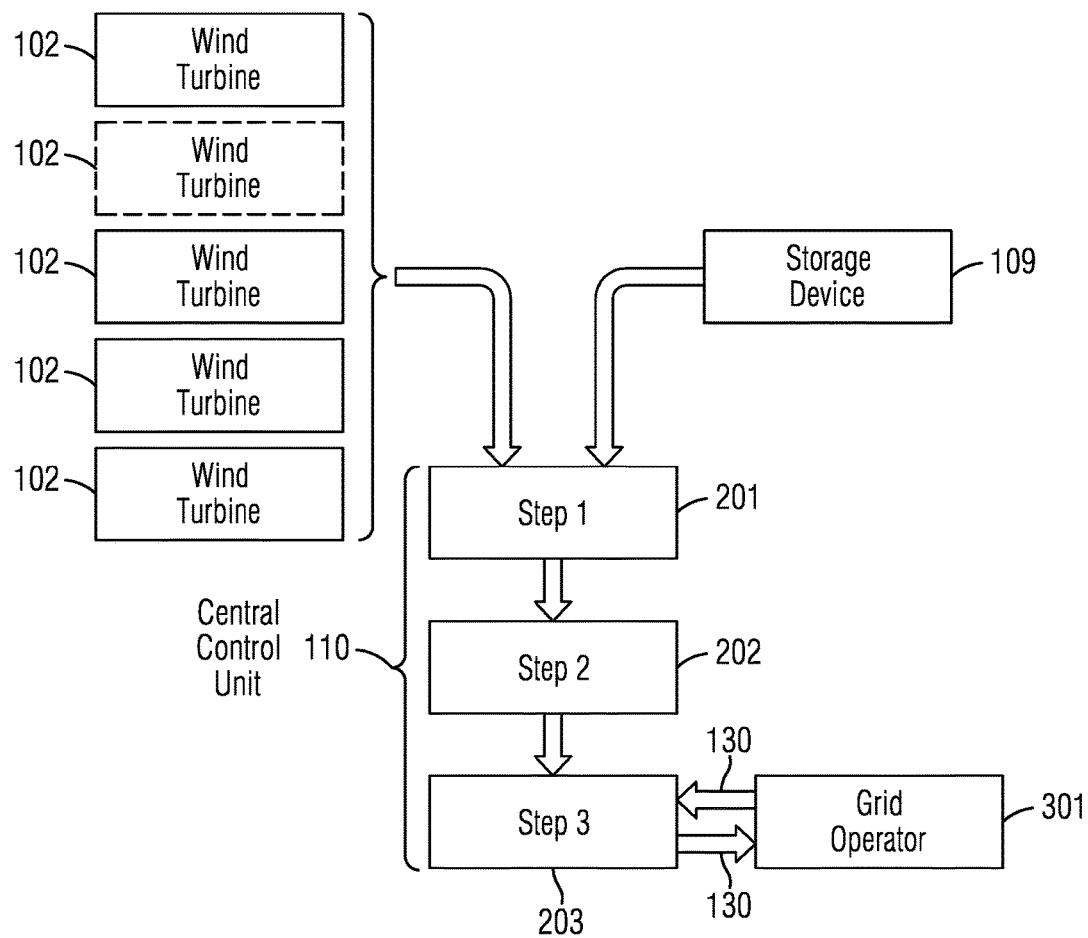
FIG. 2 represents a block diagram illustrating a possible embodiment of the method according to the present invention.

With reference to FIG. 2, during normal operation and prior to any grid frequency events the central control unit 110 collects capabilities for each of the wind turbines 102 and calculates a combined capability like for example under frequency response capability. If, according to possible embodiments of the invention, the power plant 100 further comprises a storage device 109, the central control unit 110 collects capabilities also for the storage device 109.

The central control unit 110 performs a plurality of operations before providing the output data record to an operator 301 of the electric distribution grid 300.

In a first step 201, if the capability of each wind turbines 102 is reported back as percentages of each turbine maximum capabilities the values have to be normalized and referred to the plant maximum capability before all the contribution are summed.

In a second optional step 202, the central control unit 110 calculates the system loss or contribution degradation caused by internal losses. The infrastructure, depending on the site design and layout (in particular on selected cable type, cable distances, transformer type, ration, tap position, temperature, filter status, etc.), may cause a certain kind of loss, and such a loss is applied to the calculated capability as a percentage or as a value to be subtracted from the combined response. For example the loss may be calculated from a look up table or as a proportional value of the resulting power or by some other complex calculation representing the incurred loss expected on at the resulting power delivery level.

In a third step 203, the central control unit 110 sums the contributions of subtract the losses for producing the output data record, which may be in the form of one or more records of the same type of the input data records:
X1: magnitude, in percentage of an actual production or of an installed capacity of the electric power plant, representing the power limit which the power plant can provide to, or absorb from the distribution grid,
X2: ramp rate for reaching X1 value,
X3: duration of the service.

According to possible embodiments of the present invention, three records may assume the following values:
X1: 6% to 10% of actual production (or installed capacity),
X2: 10%/s,
X3: from 0 s to T1,
and/or
X4: 2% to 3% of actual production (or installed capacity),
X5: 10%/s,
X6: from T1 to T2,
and/or
X7: 1% of actual production (or installed capacity),
X8: 10%/s, X9: from T2 to T3.

Typically, T1 is comprised between 8 and 15. According to a possible embodiment of the present invention, T1 is 10 s. Typically, T2 is comprised between 500 and 700. According to a possible embodiment of the present invention, T1 is 600 s. Typically, T3 is comprised between 1500 and 2000. According to a possible embodiment of the present invention, T3 is 1800 s.

According to other possible embodiments of the present invention, a fourth record may be calculated for time duration over T3.

According to other embodiments of the present invention magnitudes X1, X4 and X7 may also assume in general values A, B, C, respectively, e.g. corresponding to an absolute power value or to a codified identifier.

In these cases, the records may be:
X1: A,

X2: 0.1*X1/t (where t represents time, for example in seconds),
X3: from 0 s to 10 s,
and/or
X4: B (different or equal to A),
X5: 0.1*X4/t (where t represents time, for example in seconds),
X6: from 10 s to 600 s,
and/or
X7: C (different or equal to A and/or B),
X8: 0.1*X7/t (where t represents time, for example in seconds),
X9: from 600 s to 1800 s.

According to other possible embodiments of the present invention, magnitudes X1 or X4 or X7 are negative values, meaning that the power plant is available to reduce power output or even absorb power from the distribution grid. In addition, different model turbines may not be able to ramp with the same ramp rate. Given the wind distribution in the plant and the different ramping capabilities of the different wind turbines central control unit 110 is able to establish a resulting ramp rate to be provided as part of the output data.

According to further possible embodiments of the present invention, the central control unit 110 may calculate, instead of the records described above, a matrix, a vector or complex number or as an xml string or some other method.

The data exchange may contain multiple records (or matrix, or vector, etc.) or it could be agreed as a convention that the times and the ramps are all ways fixed with the operator of the electric distribution grid 300, so all that needs to be communicated are magnitudes X1, X4, X7.

According to further possible embodiments of the present invention, the central control unit 110 may provide only part of the calculations, the rest being provided by the individual control units of the plurality of wind turbines 102. For example, turbines 102 may be grouped, each group corresponding to one line 103, so that one individual control units for each group reports the data for the group as a whole, while the central control unit 110 calculates the resulting output data from all the groups of turbines.

In all cases, the output data record relating the overall capability of the power plant 100, in any possible form, is provided to an operator of the electric distribution grid 300, by means of the external communication line 130.

In all cases, the method comprises the step of receiving a validation signal from the operator of the electric distribution grid 300. The validation signal confirms or does not confirm that the stated ancillary service capability are compliant with the standards and/or the needs of the electric distribution grid.

Optionally, the method may include the final step of commanding the execution of the service associated with the output data records, to verify the stated capability.

If a storage device is present, such device can equally contribute data in the same format based on its charge level and storage capability so that the central control unit 110 can simply include such contribution to the other contributions from the plurality of wind turbine 102.

In case of over frequency response, the central control unit 110 operates in the same way as in the under frequency response providing the operator of the electric distribution grid 300 an output data record in the same format of that used for under frequency response, in particular a record including X1, X2 and X3 values.

For plants containing a power system stabilizer, the magnitude of the response may not be the same all the time, and depending on the plant components and the internal losses the possible contribution can be aggregated to a plant level available contribution given the actual conditions in the plant dynamically over time. In such a case the capability of the plant 100 may be set of periodically variable output data described by sinusoidal amplitude and a frequency or by a sinusoidal amplitude range and a frequency range.

Even when the power plant 100 is not able to produce power because of low wind conditions it may be able to reduce the demand temporarily if commanded to. This is because a wind power plant standing idle at no wind, has internal consumption for yaw motors, heaters, dehumidifiers, hydraulic pumps, cooling fans etc. Managing this internal consumption, which requires energy from the electric distribution grid 300, will be considered typically a demand response. Therefore, output data records representing different amounts of demand reductions and duration can be accumulated and passed on to the operator of the electric distribution grid 300.

In general, generators and transmission lines serving an electric distribution grid can fail at any time. Contingency reserves restore the generation/load balance after the sudden unexpected loss of a major generator or transmission line. For restoring the generation/load balance "spinning reserve" may be provided by a power plant as an ancillary service. Spinning reserve is normally defined as a power reserve which can be supplied by generation plants that are connected to the electric distribution grid, less than fully loaded, and which can begin responding immediately, being fully responsive within a short amount of time, for example ten minutes.

The power plant 100 may provide a spinning reserve to the electric distribution grid 300. Dynamic calculations of the level of spinning reserve could be calculated by the central control unit 110 at any given time, given the wind speed. Typically, an output data record for spinning reserve is provided in the same format of under frequency response.

Ancillary services may comprise voltage control. This involves the control of reactive power to maintain acceptable voltages throughout the power system under normal and contingency conditions. For a plant containing a plurality of turbines models and, optionally, storage devices, the reactive capability may not be a simple function but depend on the actual production level of each wind turbine 102, on the individual voltages and/or on the actual reactive energy capability of the storage device. Calculating a resulting capability based on capability input from the individual lines will be much more accurate than performing a purely central capability calculation, however the plant internal losses will also be much more complex that the internal loss calculation for an active power calculation because the losses will be significantly impacted by where inside the plant such reactive power is being produced.

The measurement are performed at the central control unit 11) and at each of the devices supplying reactive power. This means that the loss calculation may need to include a representation of the distance back to the measurement point or even a load flow model for the plant in order to further improve the accuracy of the resulting estimation. The loss model shall represent a valid transfer function from the sum of the individual devices to the central point. This can be modeled using a neural network type approach, or it can be a numerical model of the network like what is typically used for a load flow study.

Optionally, according to possible embodiments of the present invention, the output data record may include a numerical or character field, indicating which of the capabilities of the power plant 100 are made available for the electric distribution grid 300. For example, such field may assume one set of values if the output data record transmitted to the operator of the electric distribution grid 300 relates to under frequency response and another set of values if the output data record relates to voltage control.

According to possible embodiments of the present invention, a plurality of output data records describing each a set of ancillary service capability may be provided towards the electric distribution grid 300. For example, one output data record for under frequency, one for over frequency, one for power system stabilizer, one for ramping, one for reactive import one for reactive export etc.

According to other possible embodiments of the present invention, a single data record including data about a plurality of available ancillary service capabilities may be provided towards the electric distribution grid 300. For example, one single output data record for under frequency and over frequency and power system stabilizer and ramping, and reactive power etc.

If a grid operator wanted to request a transient under frequency response they would be able to just execute the request and validate that the functionality is fully available with very little risk to the grid stability if done on one plant at the time.

This could potentially cause grid operators to reduce their safety margins and reduce power prices to the customers, and it would make it possible to address plants who do not offer the services that they have agreed to.

The invention claimed is:

1. A method for validating and controlling an electric power plant capability as an electric service provider, the electric power plant comprising a plurality of renewable energy devices connected to an electric distribution grid, the method comprising:
   receiving a plurality of input data records from the plurality of the renewable energy devices, respectively, the input data records respectively defining a plurality of device capabilities associated with at least one electrical service to be provided by the renewable energy devices to the electric distribution grid,
   estimating internal power losses of the electric power plant,
   using the input data records and the internal power losses for calculating an output data record defining the electric power plant capability for said electrical service,
   communicating the output data record to an operator of the electric distribution grid,
   responsive to the output data record, receiving a validation signal from the operator of the electric distribution grid confirming or not confirming that the electric power plant capability for said electrical service is compliant with a standard and/or need of the electric distribution grid; and
   commanding execution of said electrical service by the electric power plant to solve a load imbalance in response to a confirming validation signal.

2. The method according to claim 1,
   wherein the output data record represents a magnitude and/or a duration of the electrical service.

3. The method according to claim 1,
   wherein the electrical service being at least one of under frequency response or over frequency response or ramping capability or reactive power capability or spinning reserve or other ancillary service.

4. The method according to claim 1,
   wherein the input and/or output data records include at least a record of values (X1, X2, X3) comprising a first value (X1) representing a percentage of an actual production or of an installed capacity of one of the renewable energy devices and/or of the electric power plant, a second value (X2) representing a ramp rate for reaching the first value and a third value (X3) representing a duration of the service.

5. The method according to claim 4,
   wherein the output data records include at least three records (X1, X2, X3; and X4, X5, X6; and X7, X8, X9), the third value (X3) of the first record being comprised between 0 and a first end time (T1), the third value (X6) of the second record being comprised between the first end time (T1) and a second end time (T2), the third value (X9) of the third record being comprised between the second end time (T2) and a third end time (T3).

6. The method according to claim 5, wherein:
   T1 is comprised between 8 and 15 seconds;
   T2 is comprised between 500 and 700 seconds;
   T3 is comprised between 1500 and 2000 seconds.

7. The method according to claim 4,
   wherein the first value is comprised between 6% and 10%.

8. The method according to claim 4,
   wherein the first value is comprised between 2% and 3%.

9. The method according to claim 4,
   wherein the first value is less than 2%.

10. The method according to claim 4,
    wherein the first value is negative.

11. A control unit adapted to execute the method according to claim 1 for validating the capability of the electric power plant comprising the plurality of renewable energy devices.

12. An electric power plant for implementing the method of claim 1, the electric power plant comprising:
    a central control unit adapted to receive the plurality of input data records from the plurality of renewable energy devices and to validate and to control the capability of the electric power plant as an electric service provider to the electric distribution grid to solve the load imbalance.

13. The electric power plant according to claim 12,
    wherein the plurality of renewable energy devices comprises wind turbines and/or tidal turbines and/or wave turbines and/or solar generators.

14. The electric power plant according to claim 13,
    wherein the electric power plant further comprises a storage device and/or a static synchronous compensator and/or a reactor.

15. The method of claim 1 accomplished on a wind power plant when the plant is not able to produce power because of a low wind condition, the at least one electrical service comprising managing internal electric consumption.

16. A method implemented with an electric power plant, the power plant comprising a plurality of individual renewable energy devices and being connected to an electric distribution grid subject to short-term load imbalances, the method comprising:
    determining a capability of each of the renewable energy devices to provide an ancillary service;
    determining an overall capability of the electric power plant to provide the ancillary service to the electric distribution grid upon request by an operator of the electric distribution grid by aggregating the capabilities of the renewable energy devices and taking into account internal power losses of the electric power plant;

communicating the overall capability of the electric power plant to the operator of the electric distribution grid; and providing the ancillary service to the electric distribution grid upon receipt of a validation from the operator of the electric distribution grid that the overall capability of the electric power plant is compliant with a standard and/or need of the electric distribution grid to solve a load imbalance.

17. The method of claim 16, wherein the ancillary service comprises at least one of the group of frequency support, voltage support, system restoration, reactive power capability and spinning reserve.

18. The method of claim 16 accomplished on a wind power plant when the wind plant is not able to produce power because of a low wind condition, the ancillary service comprising managing internal electric consumption of the wind plant.

* * * * *